United States Patent
Tom et al.

(10) Patent No.: US 8,902,590 B2
(45) Date of Patent: Dec. 2, 2014

(54) SOLAR POWERED APPARATUS HAVING A THERMALLY DECOUPLED SOLAR PANEL FOR TRACKING A PORTABLE ASSET

(75) Inventors: Steven M. Tom, San Diego, CA (US); John P. Oeth, San Diego, CA (US); Clayton G. Dumstorff, San Diego, CA (US)

(73) Assignee: Omnitracs, LLC, San Diego, CA (US)

( * ) Notice: Subject to any disclaimer, the term of this patent is extended or adjusted under 35 U.S.C. 154(b) by 336 days.

(21) Appl. No.: 13/371,747

(22) Filed: Feb. 13, 2012

(65) Prior Publication Data

US 2013/0208423 A1  Aug. 15, 2013

(51) Int. Cl.
*H05K 7/20* (2006.01)
*H01L 31/052* (2014.01)

(52) U.S. Cl.
USPC ........... 361/704; 361/690; 361/715; 361/709; 361/711; 136/246; 136/259

(58) Field of Classification Search
USPC .......... 361/690, 704, 709, 711, 715; 136/246, 136/259
See application file for complete search history.

(56) References Cited

U.S. PATENT DOCUMENTS

| | | | | |
|---|---|---|---|---|
| 3,603,952 A * | 9/1971 | Smith | ................. | 340/539.26 |
| 4,095,997 A * | 6/1978 | Griffiths | .............. | 136/248 |
| 4,759,735 A | 7/1988 | Pagnol et al. | | |
| 5,121,307 A * | 6/1992 | Moore | .................. | 362/183 |
| 5,250,265 A * | 10/1993 | Kawaguchi et al. | ........ | 422/107 |
| 5,453,729 A * | 9/1995 | Chu | ..................... | 340/332 |
| 5,537,111 A * | 7/1996 | Martin et al. | .............. | 340/983 |
| 6,366,739 B1 * | 4/2002 | Yoshihara et al. | ........... | 396/304 |
| 6,406,153 B1 | 6/2002 | Yang | | |
| 7,241,023 B1 * | 7/2007 | Carpenter | ............... | 362/183 |
| 7,278,240 B2 * | 10/2007 | Burkart et al. | ............. | 52/155 |
| 7,815,333 B2 * | 10/2010 | Liu | ..................... | 362/145 |
| 2007/0279863 A1 | 12/2007 | Illerhaus | | |
| 2008/0061963 A1 | 3/2008 | Schnitz et al. | | |
| 2011/0005576 A1 | 1/2011 | Bullen et al. | | |
| 2011/0290234 A1 | 12/2011 | Cheng | | |
| 2012/0317900 A1 * | 12/2012 | Den Boer et al. | ........... | 52/173.3 |

FOREIGN PATENT DOCUMENTS

| | | |
|---|---|---|
| EP | 2 273 561 A1 | 1/2011 |
| JP | 7199311 A | 8/1995 |
| WO | 2009/151251 A2 | 12/2009 |

OTHER PUBLICATIONS

International Search Report and Written Opinion, dated Aug. 12, 2014, issued in International Application No. PCT/US2013/025777.

* cited by examiner

*Primary Examiner* — Anatoly Vortman
(74) *Attorney, Agent, or Firm* — Arent Fox LLP

(57) ABSTRACT

An apparatus for tracking a portable asset includes a solar panel, an electronics assembly integrated into an enclosure, and a heat spreading assembly adjacent the solar panel, the heat spreading assembly located to form an air gap separating the heat spreading assembly from the electronics assembly such that heat generated by the solar panel is dissipated in the air gap before reaching the electronics assembly.

15 Claims, 5 Drawing Sheets

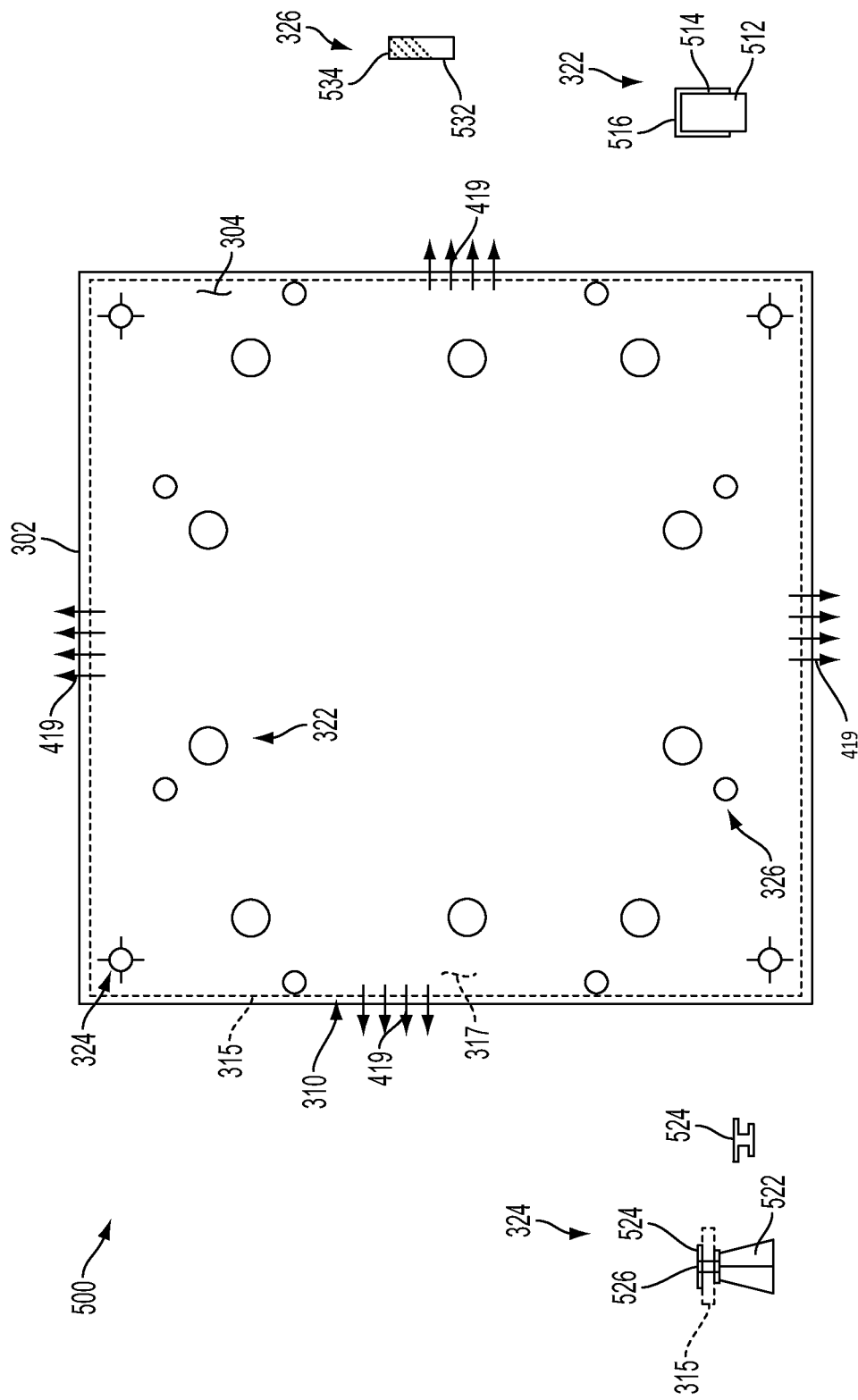

SOLAR POWERED APPARATUS HAVING A THERMALLY DECOUPLED SOLAR PANEL FOR TRACKING A PORTABLE ASSET

DESCRIPTION OF THE RELATED ART

Systems for tracking a portable asset generally include a radio transmitter, a global positioning system (GPS) device, or another type of communication device capable of periodically or continuously reporting its geographic location and other metrics relating to the portable asset to a receiving device.

In an asset tracking application, an integrated outdoor electronics enclosure can comprise a solar energy based power source, such as a solar panel and electronics that enable asset tracking in circumstances where local power may not be readily or permanently available. For example, a portable communication device that includes a solar panel power source and a satellite communication terminal integrated in a single enclosure can be located on trucks, trailers, shipping containers, cargo containers, railroad cars, or other portable or moveable assets, to determine and periodically or continuously report the position or location of the asset, as well as provide other data about the asset. These assets may be uncoupled from a stable power source for periods of time. The solar power source can be used to charge a portable power source, such as a battery, when the asset is not coupled to a stable power source.

Integrating a solar panel on an outdoor electronics enclosure is challenging due to limited physical space being available and because of the added heat load generated by the exposure of the solar panel to the sun. When the solar panel is directly coupled to the system electronics, the solar loading from the solar panel increases the internal temperature of the enclosure and the electronics within the enclosure. The increased temperature can damage and/or exceed the limits of the electronics.

Therefore, it would be desirable to minimize the amount of heat transferred from a solar panel to an electronics assembly.

SUMMARY

In an embodiment, an apparatus for tracking a portable asset comprises a solar panel, an electronics assembly integrated into an enclosure, and a heat spreading assembly adjacent the solar panel, the heat spreading assembly located to form an air gap separating the heat spreading assembly from the electronics assembly such that heat generated by the solar panel is dissipated in the air gap before reaching the electronics assembly.

BRIEF DESCRIPTION OF THE DRAWINGS

In the figures, like reference numerals refer to like parts throughout the various views unless otherwise indicated. For reference numerals with letter character designations such as "102a" or "102b", the letter character designations may differentiate two like parts or elements present in the same figure. Letter character designations for reference numerals may be omitted when it is intended that a reference numeral to encompass all parts having the same reference numeral in all figures.

FIG. 5 is a plan view illustrating the recess and standoffs of FIGS. 3 and 4.

DETAILED DESCRIPTION

Figure 1:
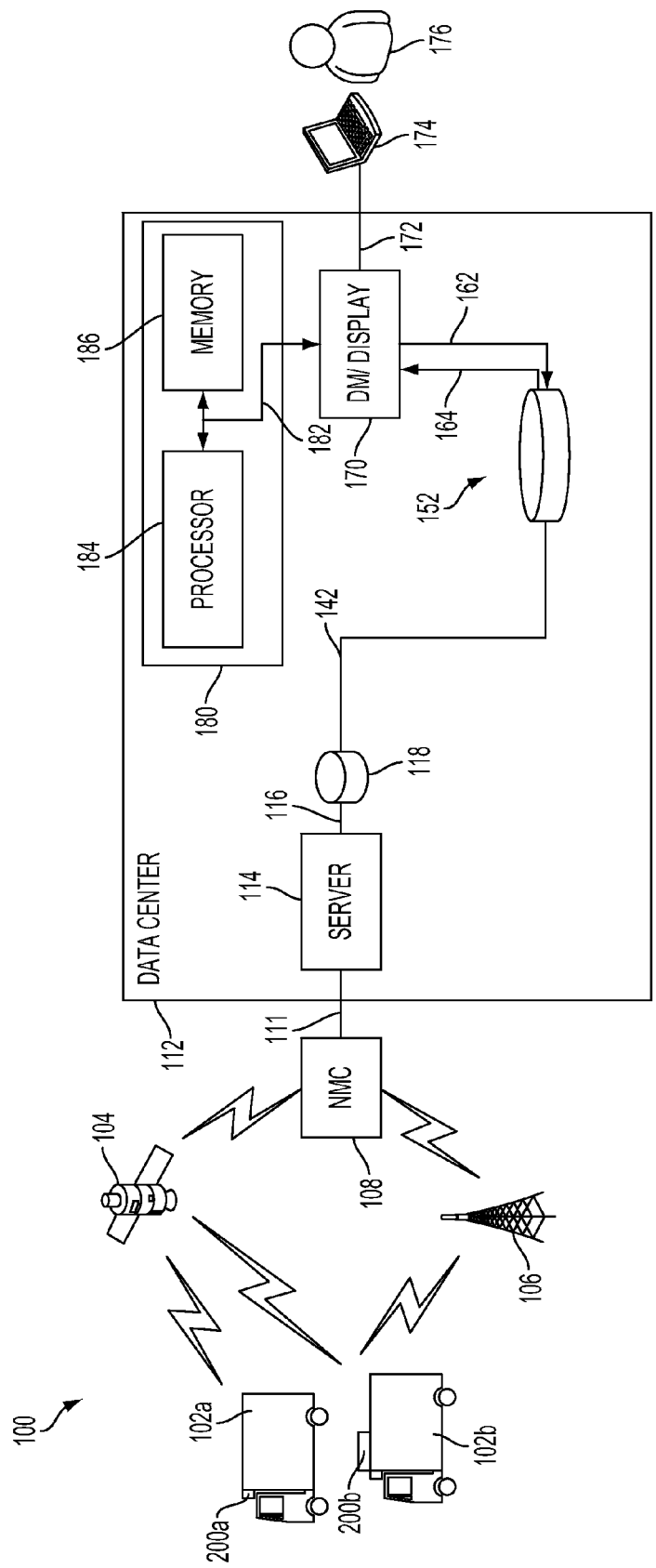
FIG. 1 is a functional block diagram illustrating exemplary elements of a system for tracking a portable asset.

The word "exemplary" is used herein to mean "serving as an example, instance, or illustration." Any aspect described herein as "exemplary" is not necessarily to be construed as preferred or advantageous over other aspects.

In this description, the term "application" may also include files having executable content, such as: object code, scripts, byte code, markup language files, and patches. In addition, an "application" referred to herein, may also include files that are not executable in nature, such as documents that may need to be opened or other data files that need to be accessed.

The term "content" may also include files having executable content, such as: object code, scripts, byte code, markup language files, and patches. In addition, "content" referred to herein, may also include files that are not executable in nature, such as documents that may need to be opened or other data files that need to be accessed.

As used in this description, the terms "component," "database," "module," "system," and the like are intended to refer to a computer-related entity, either hardware, firmware, a combination of hardware and software, software, or software in execution. For example, a component may be, but is not limited to being, a process running on a processor, a processor, an object, an executable, a thread of execution, a program, and/or a computer. By way of illustration, both an application running on a computing device and the computing device may be a component. One or more components may reside within a process and/or thread of execution, and a component may be localized on one computer and/or distributed between two or more computers. In addition, these components may execute from various computer readable media having various data structures stored thereon. The components may communicate by way of local and/or remote processes such as in accordance with a signal having one or more data packets (e.g., data from one component interacting with another component in a local system, distributed system, and/or across a network such as the Internet with other systems by way of the signal).

In this description, the terms "communication device," "wireless device," "wireless telephone," "wireless communication device," and "wireless handset" are used interchangeably. With the advent of third generation ("3G") and fourth generation ("4G") wireless technology, greater bandwidth availability has enabled more portable computing devices with a greater variety of wireless capabilities.

In this description, the term "portable computing device" ("PCD") is used to describe any device operating on a limited capacity power supply, such as a battery. Although battery operated PCDs have been in use for decades, technological advances in rechargeable batteries coupled with the advent of third generation ("3G") and fourth generation ("4G") wireless technology, have enabled numerous PCDs with multiple capabilities. Therefore, a PCD may be a cellular telephone, a satellite telephone, a pager, a personal digital assistant ("PDA"), a smartphone, a navigation device, a smartbook or reader, a media player, a combination of the aforementioned devices, and a laptop computer with a wireless connection, among others.

FIG. 1 is a functional block diagram illustrating exemplary elements of a system for tracking a portable asset. In an embodiment, the system 100 includes fleets of vehicles, each fleet having at least one vehicle. However, typically, a fleet could include many tens, hundreds or thousands of vehicles. An example fleet is illustrated as having vehicles 102a and 102b. Additional fleets (not shown) are contemplated, but not shown. Each vehicle 102 is capable of bi-directional communication using, for example, a bi-directional communications module 200. As an example, the bi-directional communications module 200a is associated with vehicle 102a and the bi-directional communications module 200b is associated with vehicle 102b. The bi-directional communications module 200 can typically be mounted vertically on a forward portion of the vehicle 102a, as illustrated by bi-directional communications module 200a, or can be mounted on the top of the vehicle 102b, as illustrated by bi-directional communications module 200b. However, other mounting locations are possible. The bi-directional communications module 200 may include, for example, the capability for satellite communication, terrestrial communication, radio frequency (RF) communication and other communication methodologies. The bi-directional communication module 200 may comprise one part or element of a larger overall asset tracking system that may include one or more modules that may be located inside of the vehicle, or asset to be tracked, and may include additional network, processing, communication and other elements. For simplicity, the bi-directional communication module 200 may also be referred to herein as an "asset tracking device" and an "integrated electronics enclosure." However, it is understood that the larger overall asset tracking system includes additional components that are not shown for simplicity of illustration.

As an example only, each vehicle 102 is in bi-directional communication with a network management center (NMC) 108 over at least one communication channel. In the example shown in FIG. 1, each vehicle 102 is in bi-directional communication with the NMC 108 over a satellite-based communication system 104 and a terrestrial-based system 106. A satellite-based communication system 104 can employ, for example, a global positioning system (GPS) communication device and a terrestrial-based communication system 106 can employ, for example, a cellular-based communication device. Other communication methodologies may also be employed and are known to those skilled in the art. Depending on many factors, data may be exchanged with the vehicles 102 using any combination of the satellite communication system 104 and the terrestrial-based communication system 106. In an embodiment, many different types of data are collected and transferred from the vehicles 102 to the NMC 108. Examples of such data include, but are not limited to, vehicle position, vehicle status, cargo status, driver performance data, driver duty status, truck performance data, critical events, messaging and position data, location delivery data, and many other types of data. All of the information that is communicated to and from the vehicles 102 is processed via the NMC 108. The NMC 108 can be thought of as a data clearinghouse that receives all data that is transmitted to and received from the vehicles 102.

The system 100 also includes a data center 112. The data center 112 illustrates one possible implementation of a central repository for all of the data received from each of the vehicles 102. As an example, as mentioned above many different types of data are transmitted from the vehicles 102 to the NMC 108. All of this data is transmitted via connection 111 to the data center 112. The connection 111 may comprise any wired or wireless dedicated connection, a broadband connection, or any other communication channel configured to transport the data.

In an illustrative embodiment, the data center 112 comprises a number of application servers and data stores, an exemplary one of each being illustrated as a server 114 and a data store 118. Details of the operation of the application server 114 and data store 118 are omitted as they are known to those skilled in the art. Although not specifically mentioned, each application server and data store includes a processor, memory including volatile and non-volatile memory, operational software, a communication bus, an input/output mechanism, and other operational systems as known in the art. The data store 118 communicates with a larger data store, referred to as a "data warehouse" 152 over connection 142. In an embodiment, the data warehouse 152 can be organized in a multiple-database structure, the details of which are not shown herein for simplicity.

The data warehouse 152 communicates with a data management and display (DM/DISPLAY) application 170. In an embodiment, the data management and display application 170 implements a set of routines that query the data warehouse 152 over connection 162 and that receives data from the data warehouse 152 over connection 164. The data management and display application 170 captures and provides this data in a usable format over connection 172 for display on a terminal device 174. In an embodiment, the data management and display application 170 is an analysis engine and is associated with an execution system 180 over a system bus 182. In an embodiment, the execution system 180 includes a processor 184 and a memory 186. The memory can store the routines that are associated with the data management and display application 170. In an embodiment, the processor 184 can execute the stored routines to implement the functionality of the data management and display application 170. Although shown as residing within the data center 112, the execution system 180 may reside elsewhere, and indeed may be implemented as a distributed system in which the memory 186 and the processor 184 are located in different places. The terminal device 174 can be a user interface portal, a web-based interface, a personal computer (PC), a laptop, a personal data assistant (PDA), a dedicated terminal, a dumb terminal, or any other device over which a user 176 can view the display provided by the terminal device 174.

Figure 2:
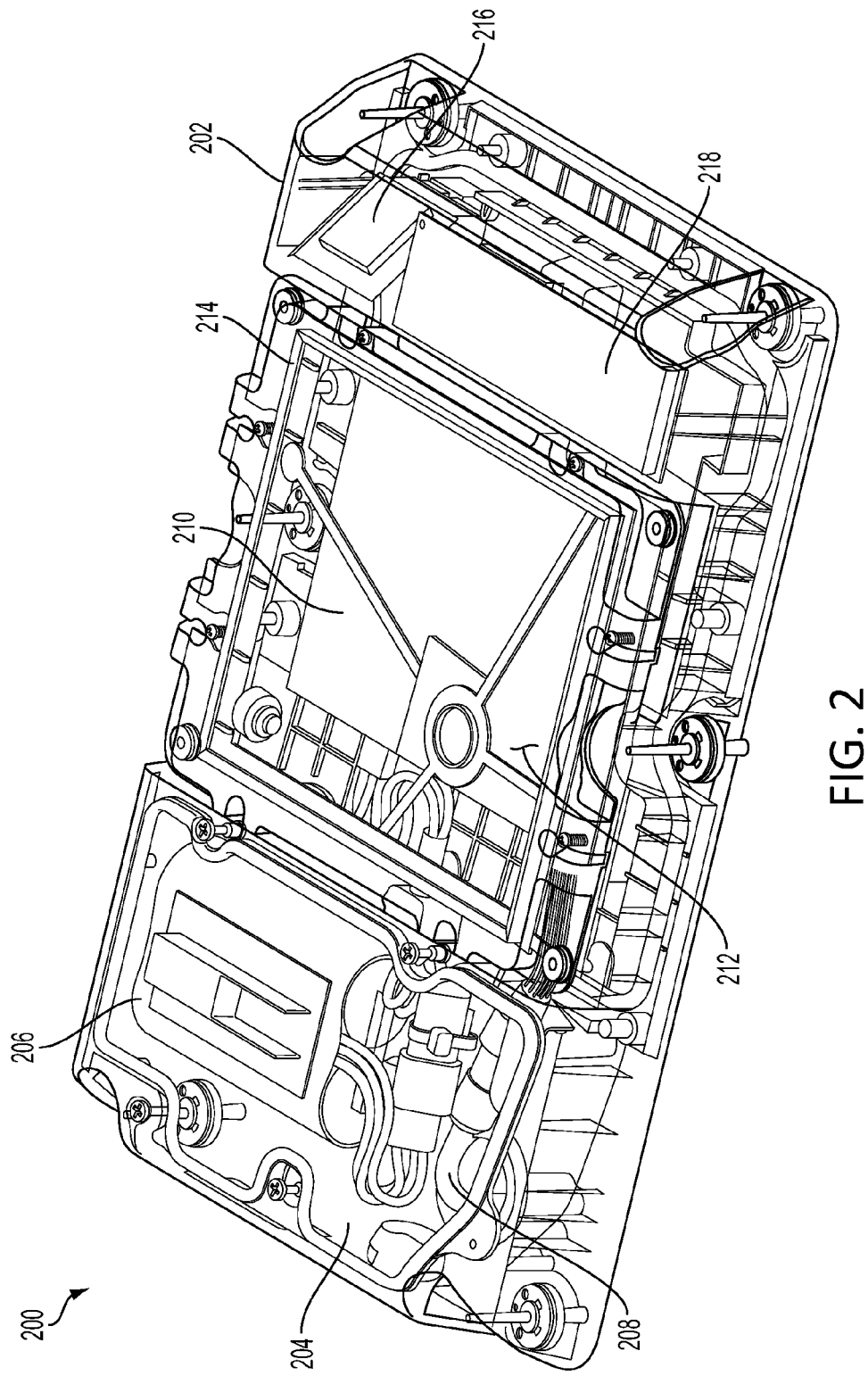
FIG. 2 is a schematic diagram illustrating an embodiment of a bi-directional communication module of FIG. 1 having a thermally decoupled solar panel for tracking a portable asset.

FIG. 2 is a schematic diagram illustrating an embodiment of a bi-directional communication module 200 of FIG. 1 having a thermally decoupled solar panel for tracking a portable asset. The bi-directional communication module 200 comprises an externally mounted integrated enclosure that resides outside of or on an exterior portion of an asset to be tracked. The asset ma be a vehicle 102 (FIG. 1) or may be a shipping container or any other asset. The bi-directional communication module 200 comprises a main housing 202 into which a number of components are integrated. The main housing 202 contains a battery compartment 204 in which a rechargeable power source, such as a battery 206 is located. A connector 208 electrically couples the main housing 202 to a vehicle power source to power the bi-directional communication module 200 when it is coupled to an asset that can provide power. The main housing 202 also comprises a solar panel 210 which provides power to the bi-directional communication module 200 when it is not connected to an asset that can provide power. The solar panel 210 can also provide charging energy to the battery 206. The solar panel 210 is located beneath a protective solar panel window 212. A solar panel gasket 214 hermetically isolates the solar panel 210 from atmospheric and ambient conditions.

In an embodiment, the main housing 202 also comprises a GPS antenna 216 and a cellular communications antenna 218. While only GPS and cellular antennas are illustrated in FIG. 2, other types of communication methodologies may also be supported.

Figure 3:
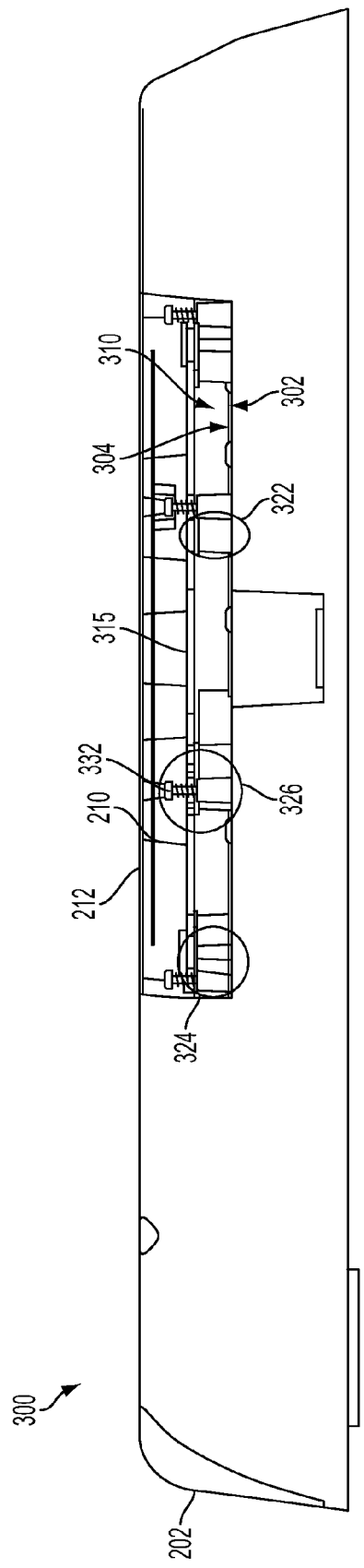
FIG. 3 is a schematic diagram illustrating a cross-section of a portion of the bi-directional communication module shown in FIG. 2.

FIG. 3 is a schematic diagram 300 illustrating a cross-section of a portion of the bi-directional communication module 200 shown in FIG. 2. The cross-section includes a portion of the main housing 202, the solar panel window 212 and the solar panel 210. A heat spreader plate 315 is located adjacent the solar panel 210. As illustrated, a recess 302 is formed in the main housing 202. The recess 302 forms a surface 304 on which a number of structural elements are provided. In an embodiment, the structural elements are referred to as standoffs, a number of different designs of which are provided for locating and mounting the heat spreader plate 315, the solar panel 210 and the solar panel window 212.

A first standoff type illustrated using reference numeral 322 comprises a standoff having a rubberized or plasticized element, which is used to locate the heat spreader plate 315 so as to create an air gap 310 in the recess 302. The height of the standoff 322 locates the heat spreader plate 315 and the adjacently located solar panel 210 with respect to the surface 304 of the recess 302.

A second standoff type is illustrated using reference 324. The standoff 324 includes a grommet which securely and removably mounts the heat spreader plate 315 in the recess 302. A third standoff type, referred to using reference numeral 326, comprises internal threads which are designed to receive a screw, an example one of which is illustrated using reference numeral 332, a number of which attach the solar panel window 212 to the main housing 202. Details of the standoff types 322, 324 and 326 will be described below.

Figure 4:
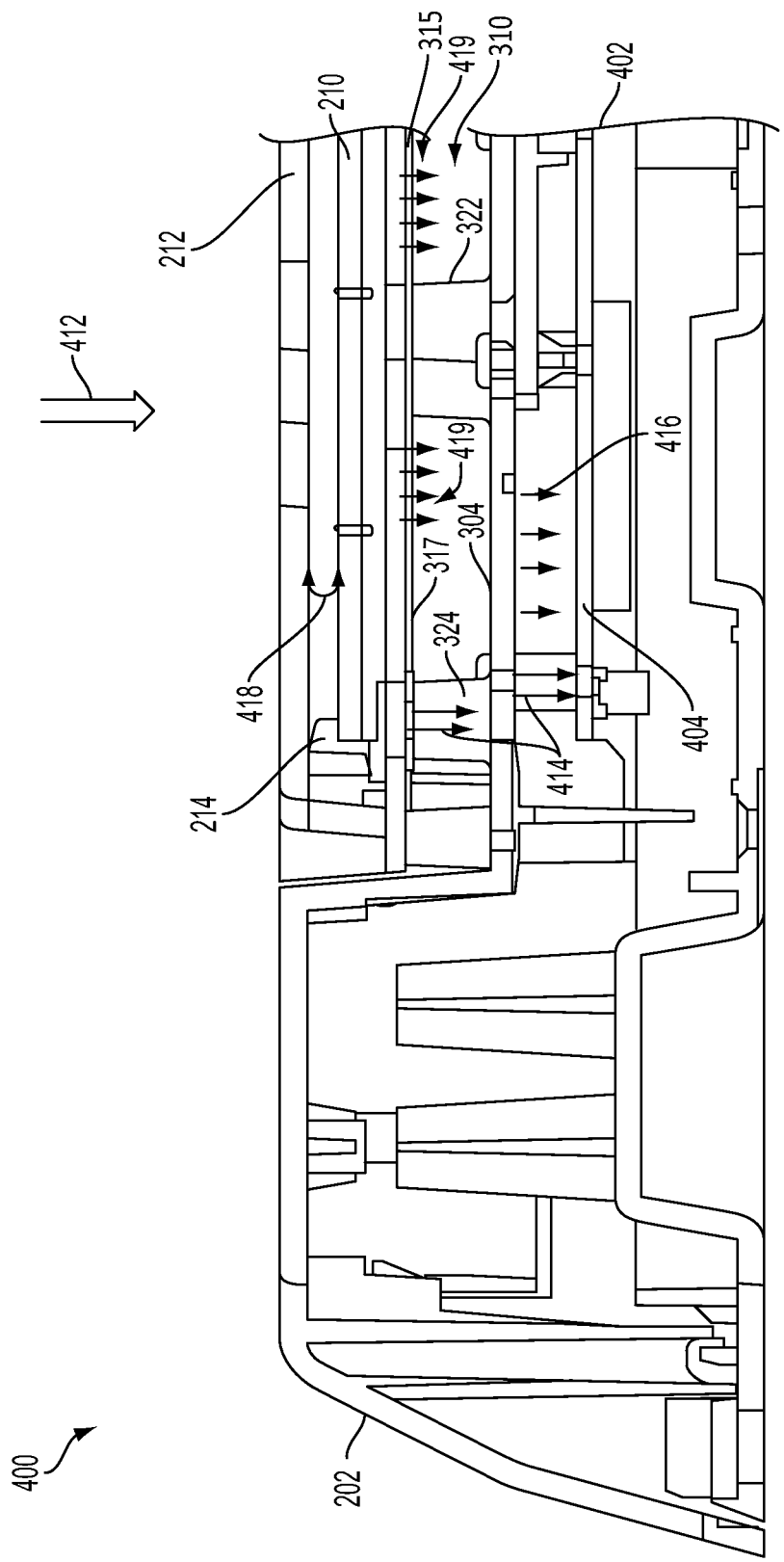
FIG. 4 is a schematic diagram illustrating a cross-section of a portion of the main housing of FIG. 3.

FIG. 4 is a schematic diagram 400 illustrating a cross-section of a portion of the main housing 202 of FIG. 3. The main housing 202 contains a solar panel 210, which is covered by the solar panel window 212. The solar panel gasket 214 hermetically isolates the solar panel 210 from atmospheric and ambient conditions. The air gap 310 separates a lower surface 317 of the heat spreader plate 315 from the surface 304. The surface 304 also forms an exterior portion of a structural element that forms a wall of an electronics enclosure 402. In an embodiment, the electronics enclosure 402 houses an electronics assembly, which is referred to as a main circuit card assembly (CCA) 404.

During operation, solar radiation, illustrated using directional arrow 412, impinges on the solar panel window 212, which is substantially transparent to solar radiation. The solar radiation 412 is transferred to the solar panel 210. The solar panel 210 converts the solar radiation 412 to electricity to charge the rechargeable power source 206 (FIG. 2). However, a greenhouse effect occurs between the solar panel window 212 and the solar panel 210, as illustrated using arrows 418. This greenhouse effect creates heat between the solar panel window 212 and the solar panel 210. In addition to the heat generated by the greenhouse effect, normal operation of the solar panel 210 results in heat being generated by the solar panel 210. The heat spreader plate 315 is located adjacent to the solar panel 210 and is designed to transfer heat from the solar panel 210 to the air gap 310, which helps to dissipate the heat and prevent the heat from reaching the main circuit card assembly 404. Heat is removed from the heat spreader plate 315 by convection to the air located in the air gap 310, as depicted by the arrows 419. Heat is also removed from the heat spreader plate 315 by radiation and convection from the exposed portions of the heat spreader plate 315 to the surface 304 and other plastic portions of the main housing 202, standoffs 322 and the standoffs 324.

In addition to dissipating heat generated by the solar panel 210 via the heat spreader plate 315 and the air gap 310, a heat flow path 414 is created through the standoffs 322 and the standoffs 324. Further, radiation and conduction heat flow paths are illustrated using reference numeral 416. In accordance with an embodiment of the invention, heat spreader plate 315 and the air gap 310 cooperate to prevent heat generated by the operation of the solar panel 210 from reaching the main CCA 404 via heat flow path 416.

FIG. 5 is a plan view 500 illustrating the recess and standoffs of FIGS. 3 and 4. As described above, the recess 302 in the main housing 202 comprises a surface 304 on which a number of different standoff types are located. The standoffs locate and secure the heat spreader plate 315 (not shown) and the solar panel window 212 (not shown). The first standoff type 322 comprises a body portion 512 and a cap 514. The body portion 512 can be molded or otherwise provided or installed as part of the main housing 202, while the cap 514 can be a rubberized, plasticized, or other flexible material that is mounted over the body portion 512. The surface 317 (FIG. 4) of the heat spreader plate 315 rests on a top surface 516 of the cap 514.

A second standoff type 324 includes a body portion 522 and a grommet 524. The heat spreader plate 315 is illustrated in dotted line to show how the grommet is received in a hole in the heat spreader plate 315. The grommet 524 then mounts over a post 526 formed over the body portion 522 of the standoff 324 to mechanically isolate the heat spreader plate 315 from the main housing 202. This mounting structure provides a heat flow path 414 (FIG. 4) to provide heat transfer from the heat spreader plate 315 to the main housing 202 in addition to the heat dissipation provided by the air gap 310.

A third standoff type 326 comprises a body portion 532 that includes internal threads 534. Alternatively, a smooth hole or recess may be formed in the body portion 532 to receive a self-tapping screw. If threaded, the internal threads 534 are configured to receive the screw 332 (FIG. 3) that is passed through holes in the solar panel window 212 to secure the solar panel window 212, the solar panel gasket 214 and the solar panel 210 to the main housing 202 without contacting the heat spreader plate 315. The heat spreader plate 315 is illustrated in phantom line in FIG. 5 and the air gap 310 is illustrated as being between the surface 304 and the rear surface 317 of the heat spreader plate 315. Heat removal from a rear surface 317 of the heat spreader plate 315, via the airgap 310, is illustrated using arrows 419.

Although selected aspects have been illustrated and described in detail, it will be understood that various substitutions and alterations may be made therein without departing from the spirit and scope of the present invention, as defined by the following claims.

What is claimed is:

1. An apparatus for tracking a portable asset, comprising:
a solar panel and an electronics assembly integrated into an enclosure; and
a heat spreading assembly adjacent the solar panel, the heat spreading assembly located to form an air gap separating the heat spreading assembly from the electronics assembly such that heat generated by the solar panel is dissipated in the air gap before reaching the electronics assembly,
wherein the air gap is defined by a first standoff type that locates the heat spreading assembly on the enclosure, and wherein the heat spreading assembly is mounted to a second standoff type, the second standoff type having a grommet that receives the heat spreading assembly and isolates the heat spreading assembly from the enclosure.

2. The apparatus of claim 1, further comprising a gasket and a cover over the solar panel, the gasket being located between the heat spreading assembly and the cover, the cover being secured to a third standoff type without contacting the heat spreading assembly.

3. The apparatus of claim 2, wherein heat from the solar panel is conducted through the first and second standoff types.

4. The apparatus of claim 1, wherein the integrated enclosure is located on a portable asset.

5. The apparatus of claim 4, wherein the integrated enclosure provides position and location information relating to the portable asset.

6. A method for thermally decoupling a solar panel from an electronics assembly, comprising:
  integrating a solar panel and an electronics assembly into an enclosure;
  locating a heat spreading assembly adjacent to the solar panel, the heat spreading assembly located to form an air gap separating the heat spreading assembly from the electronics assembly such that heat generated by the solar panel is dissipated in the air gap before reaching the electronics assembly,
  defining the air gap using a first standoff type that locates the heat spreading assembly on the enclosure; and
  mounting the heat spreading assembly to a second standoff type, the second standoff type having a grommet that receives the heat spreading assembly and isolates the heat spreading assembly from the enclosure.

7. The method of claim 6, further comprising: locating a gasket and a cover over the solar panel, the gasket being located between the heat spreading assembly and the cover; and securing the cover to a third standoff type without contacting the heat spreading assembly.

8. The method of claim 7, further comprising conducting heat from the solar panel through the first and second standoff types.

9. The method of claim 6, further comprising locating the integrated enclosure on a portable asset.

10. The method of claim 9, wherein the integrated enclosure provides position and location information relating to the portable asset.

11. A communication device, comprising:
  a solar panel and an electronics assembly integrated into an enclosure; and
  a heat spreading assembly adjacent the solar panel, the heat spreading assembly located to form an air gap separating the heat spreading assembly from the electronics assembly such that heat generated by the solar panel is dissipated in the air gap before reaching the electronics assembly,
  wherein the air gap is defined by a first standoff type that locates the heat spreading assembly on the enclosure, and
  wherein the heat spreading assembly is mounted to a second standoff type, the second standoff type having a grommet that receives the heat spreading assembly and isolates the heat spreading assembly from the enclosure.

12. The communication device of claim 11, further comprising a gasket and a cover over the solar panel, the gasket being located between the heat spreading assembly and the cover, the cover being secured to a third standoff type without contacting the heat spreading assembly.

13. The communication device of claim 12, wherein heat from the solar panel is conducted through the first and second standoff types.

14. The communication device of claim 11, wherein the integrated enclosure is located on a portable asset.

15. The communication device of claim 14, wherein the integrated enclosure provides position and location information relating to the portable asset.

* * * * *